United States Patent
Zhao

(10) Patent No.: US 11,329,252 B2
(45) Date of Patent: May 10, 2022

(54) DISPLAY MODEL, MANUFACTURING METHOD THEREOF, AND ELECTRONIC DEVICE

(71) Applicant: WUHAN CHINA STAR OPTOELECTRONICS SEMICONDUCTOR DISPLAY TECHNOLOGY CO., LTD., Wuhan (CN)

(72) Inventor: Chen Zhao, Wuhan (CN)

( * ) Notice: Subject to any disclaimer, the term of this patent is extended or adjusted under 35 U.S.C. 154(b) by 326 days.

(21) Appl. No.: 16/339,362

(22) PCT Filed: Jan. 7, 2019

(86) PCT No.: PCT/CN2019/070688
§ 371 (c)(1),
(2) Date: Apr. 4, 2019

(87) PCT Pub. No.: WO2020/098135
PCT Pub. Date: May 22, 2020

(65) Prior Publication Data
US 2021/0193956 A1 Jun. 24, 2021

(30) Foreign Application Priority Data

Nov. 13, 2018 (CN) .......................... 201811343313.1

(51) Int. Cl.
*H01L 27/32* (2006.01)
*H01L 51/00* (2006.01)
*H01L 51/52* (2006.01)
*H01L 51/56* (2006.01)

(52) U.S. Cl.
CPC ........ *H01L 51/5253* (2013.01); *H01L 27/322* (2013.01); *H01L 27/323* (2013.01); *H01L 51/0002* (2013.01); *H01L 51/5293* (2013.01); *H01L 51/56* (2013.01)

(58) Field of Classification Search
CPC ............... H01L 51/5253; H01L 27/322; H01L 51/5293; H01L 51/0002; H01L 27/323; H01L 51/56
See application file for complete search history.

(56) References Cited

U.S. PATENT DOCUMENTS

| | | | |
|---|---|---|---|
| 2016/0041667 A1 | 2/2016 | Lai et al. | |
| 2017/0097714 A1 | 4/2017 | Lee et al. | |
| 2018/0095566 A1 | 4/2018 | Lee et al. | |
| 2018/0095581 A1* | 4/2018 | Hwang | G06F 3/0445 |
| 2018/0182816 A1 | 6/2018 | Kang et al. | |
| 2018/0219144 A1* | 8/2018 | Perkins | H01L 33/42 |
| 2018/0292926 A1 | 10/2018 | Ye | |

(Continued)

FOREIGN PATENT DOCUMENTS

| | | |
|---|---|---|
| CN | 105334994 A | 2/2016 |
| CN | 106887445 A | 6/2017 |

(Continued)

*Primary Examiner* — Kyoung Lee

(57) ABSTRACT

A display module, a method of manufacturing the display module, and an electronic device include an array substrate, a light-emitting device layer, a thin film encapsulation layer, a touch layer, a polarizer layer, and a cover layer. The polarizer layer and the cover layer are formed on the light-emitting device layer through a deposition process.

11 Claims, 4 Drawing Sheets

(56) References Cited

U.S. PATENT DOCUMENTS

2018/0342568 A1 11/2018 Jin et al.
2019/0067636 A1 2/2019 Senoo et al.

FOREIGN PATENT DOCUMENTS

| CN | 106896959 A | 6/2017 |
| CN | 106952941 A | 7/2017 |
| CN | 107887409 A | 4/2018 |
| CN | 107994129 A | 5/2018 |
| CN | 108242455 A | 7/2018 |
| CN | 108598109 A | 9/2018 |
| CN | 108615821 A | 10/2018 |
| CN | 108663851 A | 10/2018 |
| CN | 108702820 A | 10/2018 |

* cited by examiner

DISPLAY MODEL, MANUFACTURING METHOD THEREOF, AND ELECTRONIC DEVICE

CROSS REFERENCE TO RELATED APPLICATIONS

This application is a U.S. national phase application of a PCT Application No. PCT/CN2019/070688 filed on Jan. 7, 2019, which claims priority to Chinese Patent Application No. 201811343313.1 filed on Nov. 13, 2018, the disclosures of which are incorporated in their entirety by reference herein.

BACKGROUND OF INVENTION

1. Field of Invention

The present invention relates to a technical field of displays, and particularly to a display module, a manufacturing method thereof, and an electronic device.

2. Related Art

In flat panel display technology, organic light-emitting diode (OLED) displays have become the third generation of display technology after liquid crystal displays due to advantages of being light in weight, being self-luminous, quick response times, wide viewing angles, wide color gamut, high brightness, and low power consumption.

Existing flexible OLED display modules include a cover layer, a polarizer layer, a touch layer, an OLED layer, and an array substrate etc., and part of film layer structures needs to be bonded by an optical adhesive. Because the transmittance of the optical adhesive is not 100%, there is a loss of light when light passes through the optical adhesive between the film layer structures after being emitted from a light emitting device layer. Therefore, the existence of the optical adhesive reduces light extraction efficiency of the light emitting device layer. Furthermore, when flexible screens are bent, wrinkles and creases are prone to being formed in optical adhesives.

Therefore, the present application comes up with following technical solutions based on the above-mentioned technical problems.

SUMMARY OF INVENTION

An object of the present application is to provide a display module, a manufacturing method thereof, and an electronic device to overcome a technical problem of poor light extraction of existing display modules.

To overcome the above-mentioned problem, the present application provides a technical solution as follows:

The present application provides a display module, comprising: an array substrate; a light-emitting device layer disposed on the array substrate; a thin film encapsulation layer disposed on the light-emitting device layer; a polarizer layer disposed on the thin film encapsulation layer; a cover layer disposed on the polarizer layer; wherein the polarizer layer and the cover layer are disposed on the light-emitting device layer through a deposition process.

In the display module of the present application, the display module further comprises a touch layer and a color film layer both disposed between the polarizer layer and the thin film encapsulation layer, and wherein the touch layer is located on the color film layer.

In the display module of the present application, the display module further comprises a touch layer and a color film layer both disposed between the polarizer layer and the thin film encapsulation layer, and wherein the color film layer is located on the touch layer.

In the display module of the present application, the display module further comprises a touch layer and a color film layer both disposed between the polarizer layer and the cover layer, and wherein the color film layer is located on the touch layer.

In the display module of the present application, the display module further comprises a touch layer and a color film layer both disposed between the polarizer layer and the cover layer, and wherein the touch layer is located on the color film layer.

In the display module of the present application, an area of the color film layer is same as an area of a display area of the display module.

In the display module of the present application, an area of the polarizer layer is greater than an area of a display area of the display module.

In the display module of the present application, the cover layer comprises a flexible layer and a hardened layer, and the hardened layer is disposed on the flexible layer, and wherein the flexible layer and the hardened layer are formed by a deposition process.

The present application further provides a method of manufacturing a display module, comprising: providing an array substrate; forming a light-emitting device layer and a thin film encapsulation layer in sequence on the array substrate; forming a polarizer layer on the thin film encapsulation layer through a first deposition process; and forming a cover layer on the polarizer layer through a second deposition process.

In the manufacturing method of the present application, prior to forming the polarizer layer on the thin film encapsulation layer, the manufacturing method further comprises: depositing a touch layer on the thin film encapsulation layer; and depositing a black light shielding layer on the touch layer, and patterning the black light shielding layer to form a black matrix layer; and forming a color film layer by depositing a color filter layer on the black matrix layer.

In the manufacturing method of the present application, prior to forming the polarizer layer on the thin film encapsulation layer, the manufacturing method further comprises: depositing a black light shielding layer on the thin film encapsulation layer, and patterning the black light shielding layer to form a black matrix layer; forming a color film layer by depositing a color filter layer on the black matrix layer; and depositing a touch layer on the color film layer.

In the manufacturing method of the present application, after forming the polarizer layer on the thin film encapsulation layer, the manufacturing method further comprises: depositing a black light shielding layer on the polarizer layer, and patterning the black light shielding layer to form a black matrix layer; depositing a color filter layer on the black matrix layer to form a color film layer; and depositing a touch layer on the color film layer.

In the manufacturing method of the present application, after forming the polarizer layer on the thin film encapsulation layer, the manufacturing method further comprises: depositing a touch layer on the polarizer layer; depositing a black light shielding layer on the touch layer, and patterning the black light shielding layer to form a black matrix layer; depositing a color filter layer on the black matrix layer to form a color film layer.

In the manufacturing method of the present application, an area of the color film layer is same as an area of a display area of the display module.

In the manufacturing method of the present application, an area of the polarizer layer is greater than an area of a display area of the display module.

In the manufacturing method of the present application, the cover layer comprises a flexible layer and a hardened layer, and the hardened layer is disposed on the flexible layer, and wherein the flexible layer and the hardened layer are formed by the second deposition process.

The present application further provides an electronic device, comprising a display module, and the display module comprising: an array substrate; a light-emitting device layer disposed on the array substrate; a thin film encapsulation layer disposed on the light-emitting device layer; a polarizer layer disposed on the thin film encapsulation layer; a cover layer disposed on the polarizer layer; wherein the polarizer layer and the cover layer are disposed on the light-emitting device layer through a deposition process.

In the electronic device of the present application, the display module further comprises a color film layer and a touch layer disposed on the color film layer, and the touch layer and the color film layer are disposed between the polarizer layer and the thin film encapsulation layer, or the touch layer and the color film layer are disposed between the polarizer layer and the cover layer.

In the electronic device of the present application, the display module further comprises a touch layer and a color film layer disposed on the touch layer, and the touch layer and the color film layer are disposed between the polarizer layer and the thin film encapsulation layer, or the touch layer and the color film layer are disposed between the polarizer layer and the cover layer.

In the electronic device of the present application, the cover layer comprises a flexible layer and a hardened layer, and the hardened layer is disposed on the flexible layer, and wherein the flexible layer and the hardened layer are formed by the deposition process.

Advantageous effects of the present application are as follows: the present application improves light extraction efficiency of the light-emitting device layer by forming the polarizer layer and the cover layer on the thin film encapsulation layer through the deposition process without the use of an optical adhesive. As a further result, thickness of the entire display module is reduced, thereby improving bending resistance of the entire display module, and simplifying a bonding process of film layers at the same time.

BRIEF DESCRIPTION OF DRAWINGS

To describe the technical solutions in the embodiments of the present invention, the following briefly introduces the accompanying drawings for describing the embodiments. Apparently, the accompanying drawings in the following description show merely some embodiments of the present invention, and a person skilled in the art may still derive other drawings from these accompanying drawings without creative efforts.

DESCRIPTION OF PREFERRED EMBODIMENTS

The following embodiments are referring to the accompanying drawings for exemplifying specific implementable embodiments of the present invention. Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

Figure 1:
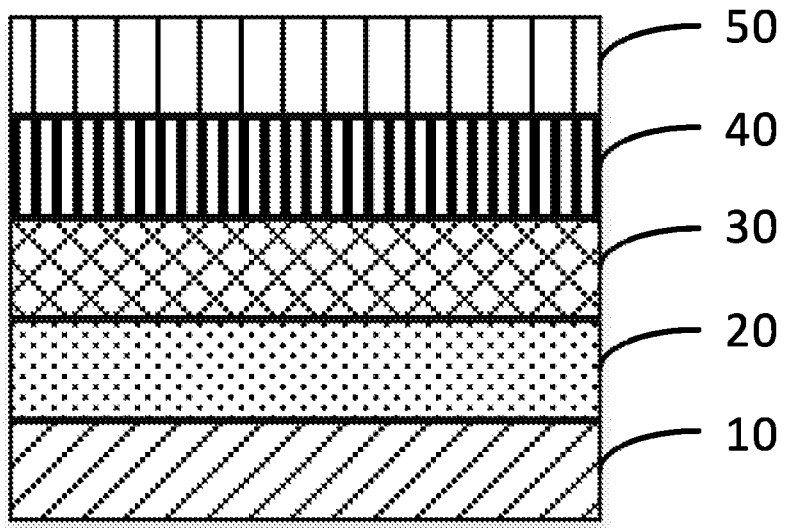
FIG. 1 is a film layer structural view of a display module of a first embodiment of the present application.

Please refer to FIG. 1. FIG. 1 is a film layer structural view of a display module of a first embodiment of the present application.

The display module 100 includes an array substrate 10, a light-emitting device layer 20, a thin film encapsulation layer 30, a polarizer layer 40, and a cover layer 50.

The array substrate 10 includes a substrate and a thin film transistor layer disposed on the substrate. In one embodiment, the substrate may be one of a glass substrate, a quartz substrate, a resin substrate, or the like. In one embodiment, the substrate may be a flexible substrate. A flexible material of the flexible substrate is not limited herein, such as a polyimide film.

The thin film transistor layer may be one of an etch barrier type, a back channel etch type, a top gate thin film transistor type, or a bottom gate thin film transistor type, and is not limited in specific.

The light-emitting device layer 20 is disposed on the array substrate 10. The light-emitting device layer 20 includes an anode layer disposed on the array substrate 10, a light-emitting layer disposed on the anode layer, and a cathode layer disposed on the light-emitting layer.

In one embodiment, a light emitting device is a top emission type organic light-emitting diode (OLED) device. Specifically, the light emitting device is a white OLED device emitting white light. Therefore, the anode layer is a non-transparent reflective layer, and the cathode layer is a transparent metal layer.

The thin film encapsulation layer 30 is disposed on the cathode layer. The thin film encapsulation layer 30 can be deposited by chemical vapor deposition (CVD), sputtering, atomic layer deposition (ALD), vacuum evaporation, ink jet printing (IJP), etc. The thin film encapsulation layer 30 is mainly configured to block moisture and oxygen and to prevent external water vapor from eroding an organic light-emitting layer. The thin film encapsulation layer 30 includes at least an organic layer and at least a non-organic layer alternately stacked.

The display module 100 further includes the polarizer layer 40. The polarizer layer 40 is directly formed on the thin film encapsulation layer 30 through a first deposition process without being bonded by an optical adhesive.

Figure 2:
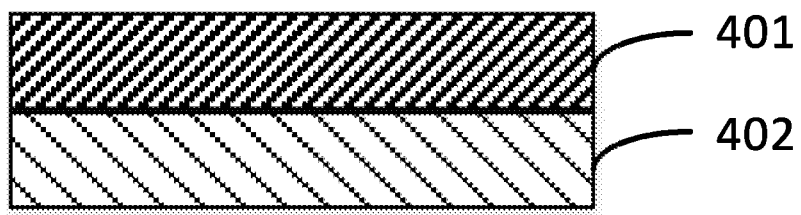
FIG. 2 is a film layer structural view of a polarizer layer of the display module of the first embodiment of the present application.

Please refer to FIG. 2. FIG. 2 is a film layer structural view of the polarizer layer of the display module of the first embodiment of the present application. The polarizer layer 40 includes a triacetate (TAC) layer and a polyvinyl alcohol (PVA) layer, and the TAC layer and the PVA layer may also be collectively referred to as a linear polarizer layer 401.

The TAC layer of the polarizer layer is mainly configured to support and protect the underneath PVA layer, and the TAC layer has a thickness of 40 um-60 um.

The PVA layer is a core part of the polarizer layer 40 and is mainly configured to absorb polarization state of light in natural light, and to form polarized light over another polarization state of light. The linear polarizer layer 401 generally includes two layers of the TAC layer, and the PVA layer is disposed between the two TAC layers to better protect the PVA layer.

In one embodiment, the polarizer layer 40 may be prepared by coating a liquid crystal material. The polarizer layer 40 formed so generally has a thickness less than 2 um.

The polarizer layer 40 further includes a phase retardation layer 402 disposed between the thin film encapsulation layer 30 and the linear polarizer layer 401. The phase retardation layer 402 is configured to compensate a phase difference between a first polarizer layer (i.e., the polarizer layer 40 in FIG. 1) and a second polarizer layer (not shown) on both sides of the display module. The first polarizer layer is located adjacent to the cover layer 50, and the second polarizer layer is located far away from the cover layer 50.

In one embodiment, the linear polarizer layer 401 can also be formed by coating on the phase retardation layer 402 through an anti-solvent method, or by other methods, such as transferring.

Please refer to FIG. 1. The display module further includes the cover layer 50 disposed on the polarizer layer 40. The cover layer 50 is mainly configured to protect film layer structures located underneath.

In one embodiment, the cover layer 50 is directly formed on the polarizer layer 40 through a second deposition process, and no optical adhesive is needed to bond the cover layer 50 and the polarizer layer 40.

Figure 3:
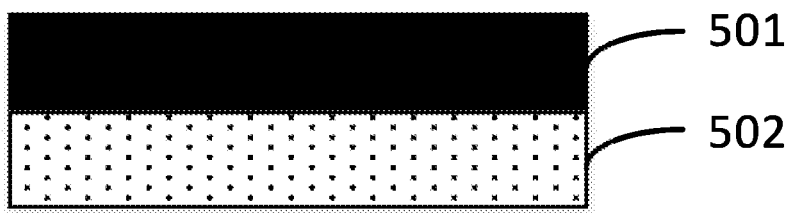
FIG. 3 is a film layer structural view of a cover layer of the display module of the first embodiment of the present application.

Please refer to FIG. 3. FIG. 3 is a film layer structural view of the cover layer of the display module of the first embodiment of the present application. The cover layer 50 further includes a hardened layer 501 and a flexible layer 502, and the hardened layer 501 is disposed on the flexible layer 502. In one embodiment, the flexible 502 can be formed by coating or transferring.

The flexible layer 502 is prepared prior to forming the hardened layer 501. In one embodiment, the flexible layer 502 may be exemplified as a polyimide film.

To enhance adhesion between film layers, a layer of an optical adhesive can be coated prior to forming the flexible layer 502. The cover layer 50 and adjacent layers are adhered by adhesion of an optical adhesive, thereby to reinforce bonding between the cover layer 50 of the display module and other film layers.

In one embodiment, the deposition of the hardened layer 501 is performed directly without performing a formation process of the flexibly layer 502.

Figure 4:
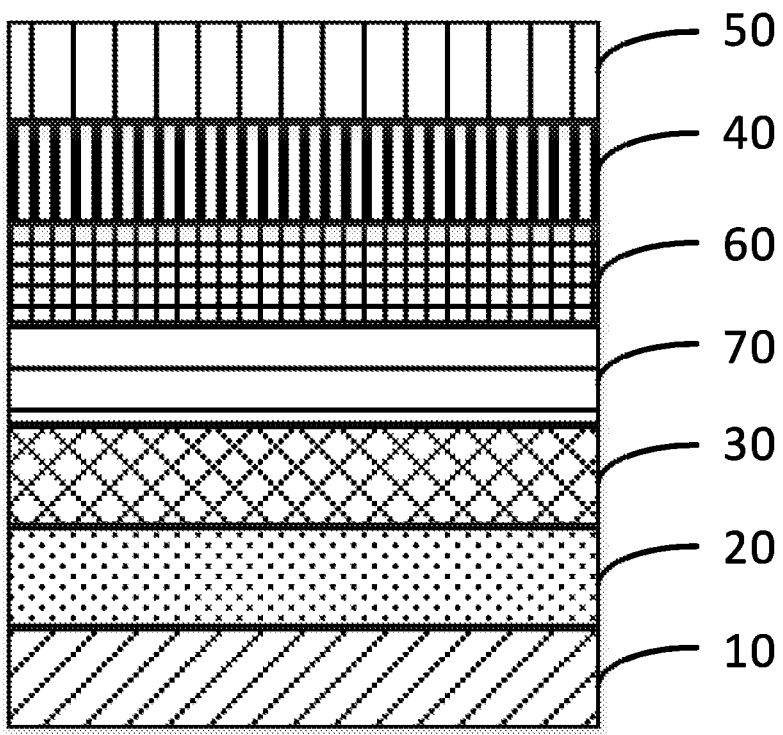
FIG. 4 is a film layer structural view of a display module of a second embodiment of the present application.

Please refer to FIG. 4. FIG. 4 is a film layer structural view of a display module of a second embodiment of the present application. The display module further includes a touch layer 60 and a color film layer 70 both disposed between the polarizer layer and the thin film encapsulation layer.

In one embodiment, the touch layer 60 is located on the color film layer 70.

In one embodiment, the color film layer 70 is located on the touch layer 60.

Please refer to FIG. 4. The color film layer 70 of this embodiment is disposed on the thin film encapsulation layer 30. The color film layer 70 may be directly formed on the thin film encapsulation layer 30 after a formation process of the thin film encapsulation layer 30 is completed.

The color film layer 70 includes a color resist layer and a black matrix. The color resist layer has a red color block, a green color block, and a blue color block. The black matrix is formed between the two adjacent color blocks.

In one embodiment, the color film layer 70 is prepared by a dyeing method, a printing method, an electroforming method, an inkjet printing method, or the like.

In one embodiment, the touch layer 60 is located on the color film layer 70, and the touch layer 60 is formed by physical vapor deposition (PVD) or chemical vapor deposition (CVD).

Figure 5:
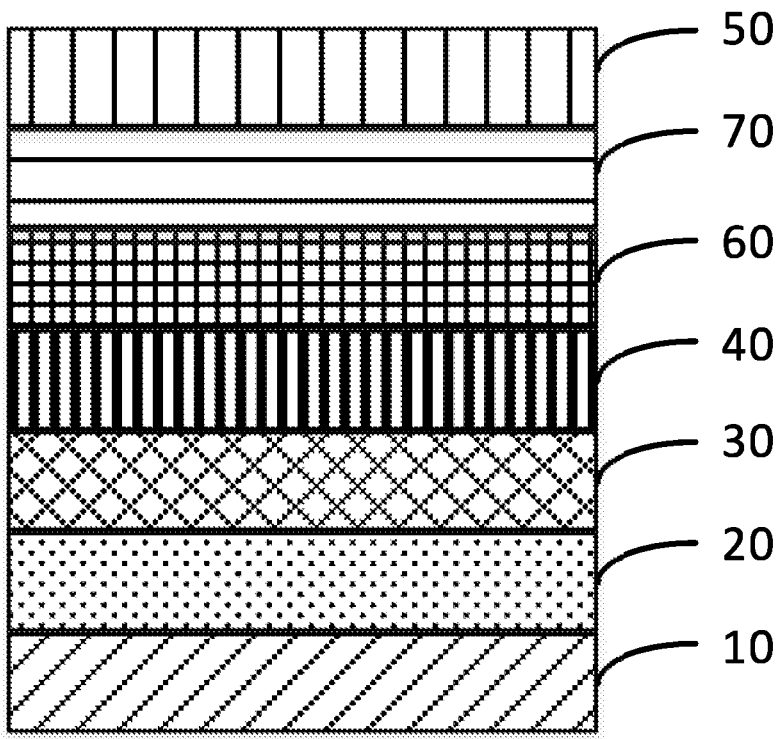
FIG. 5 is a film layer structural view of a display module of a third embodiment of the present application.

Please refer to FIG. 5. FIG. 5 is a film layer structural view of a display module of a third embodiment of the present application. The touch layer 60 and the color film layer 70 are also capable of being located between the polarizer layer 40 and the cover layer 50.

In one embodiment, the color film layer 70 is located on the touch layer 60. In one embodiment, the touch layer 60 is located on the color film layer 70.

Please refer to FIG. 5. The color film layer 70 is located on the touch layer 60.

Figure 6:
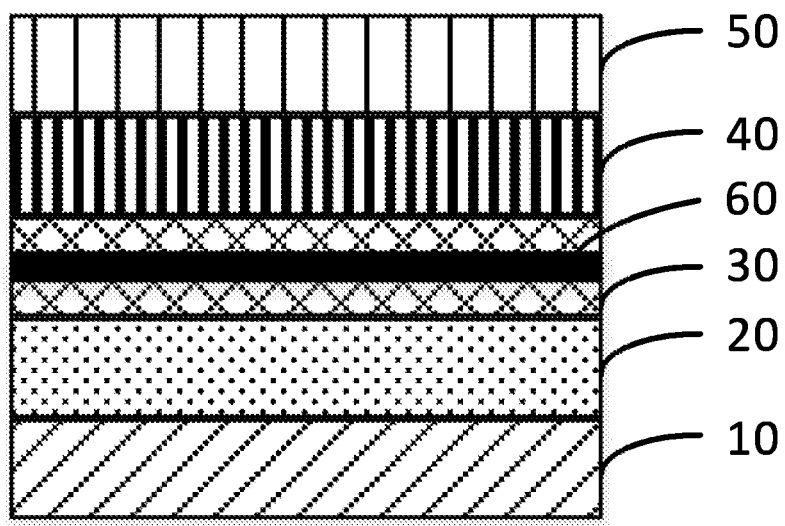
FIG. 6 is a film layer structural view of a display module of a fourth embodiment of the present application.

Please refer to FIG. 6. FIG. 6 is a film layer structural view of a display module of a fourth embodiment of the present application. The touch layer 60 may also be located at the thin film encapsulation layer 30 in view of the first embodiment to the third embodiment as mentioned above. That is, the touch layer 60 is directly formed in the thin film encapsulation layer 30 by a metal mesh, thereby to reduce thickness of film layer structure.

Figure 7:
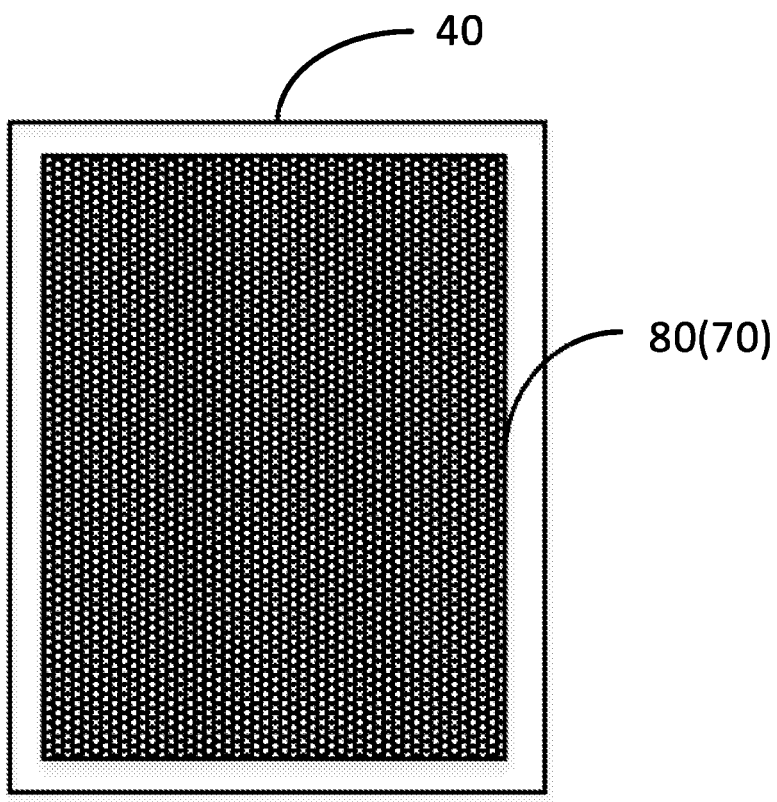
FIG. 7 is a top plan view of a display module of the present application.

Please refer to FIG. 7. FIG. 7 is a top plan view of a display module of the present application. In one embodiment, an area of the polarizer layer 40 is greater than an area of a display area 80 of the display module. An orthographic projection of the polarizer layer 40 on the array substrate 10 covers an orthographic projection of the display area 80 of the display module.

In one embodiment, an area of the color film layer 70 is the same as an area of the display area 80 of the display module. An orthographic projection of the color film layer 70 on the array substrate 10 covers the orthographic projection of the display area 80 of the display module.

The present application improves light extraction efficiency of the light-emitting device layer 20 by removing an optical adhesive among the touch layer 60, the polarizer layer 40, and the cover layer 50 such that the touch layer 60, the polarizer layer 40, and the cover layer 50 are directly deposited on the thin film encapsulation layer 30. As a result, thickness of the entire display module is reduced, thereby improving bending resistance of the entire display module, and simplifying a bonding process of film layers at the same time.

Figure 8:
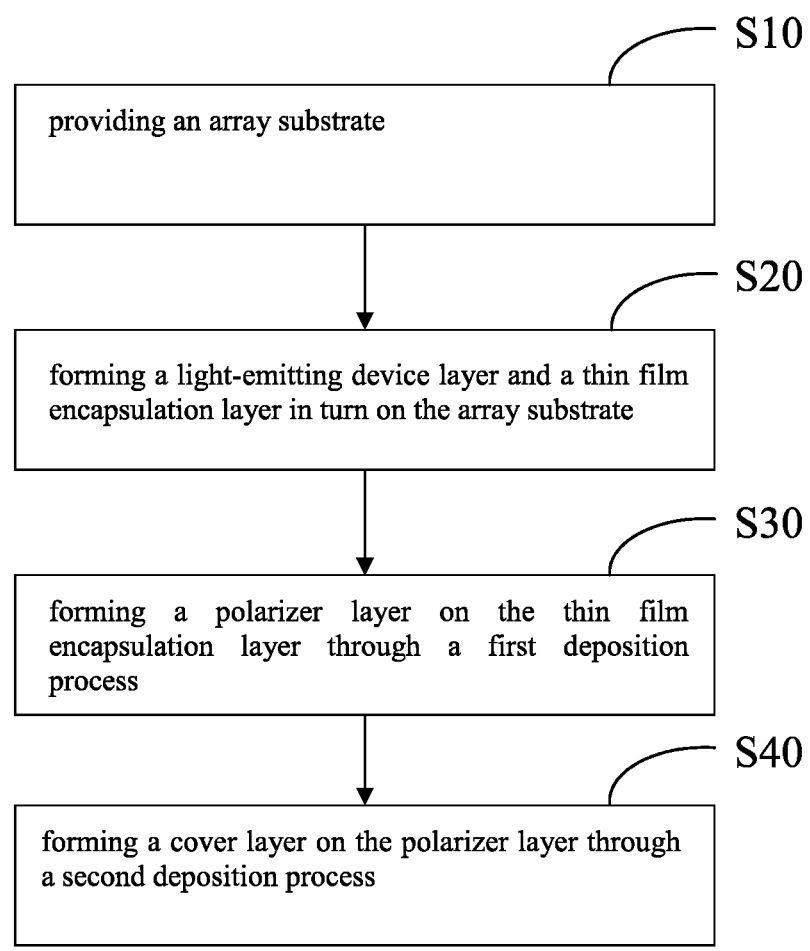
FIG. 8 is a flowchart showing a method of manufacturing a display module of the present application.

Please refer to FIG. 8. FIG. 8 is a flowchart showing a method of manufacturing a display module of the present application. The manufacturing method includes steps as follows:

S10: providing an array substrate; in this embodiment, the array substrate includes a substrate and a thin film transistor layer disposed on the substrate. In one embodiment, the substrate may be one of a glass substrate, a quartz substrate, a resin substrate, or the like. In one embodiment, the substrate may be a flexible substrate. A flexible material of the flexible substrate is not limited herein, such as a polyimide film.

The thin film transistor layer may be one of an etch barrier type, a back channel etch type, a top gate thin film transistor type, or a bottom gate thin film transistor type, and is not limited in specific.

S20: forming a light-emitting device layer and a thin film encapsulation layer in sequence on the array substrate; the light-emitting device layer 20 is disposed on the array substrate 10. The light-emitting device layer 20 includes an anode layer disposed on the array substrate 10, a light-emitting layer disposed on the anode layer, and a cathode layer disposed on the light-emitting layer.

In one embodiment, a light emitting device is a top emission type OLED device. Specifically, the light emitting device is a white OLED device emitting white light. Therefore, the anode layer is a non-transparent reflective layer, and the cathode layer is a transparent metal layer.

The thin film encapsulation layer 30 is disposed on the cathode layer. The thin film encapsulation layer 30 can be deposited by CVD, sputtering, ALD, vacuum evaporation, IJP, etc. The thin film encapsulation layer 30 is mainly configured to block moisture and oxygen and prevents external water vapor from eroding an organic light-emitting layer. The thin film encapsulation layer 30 includes at least an organic layer and at least a non-organic layer alternately stacked.

S30: forming a polarizer layer on the thin film encapsulation layer through the first deposition process; in this step, the polarizer layer 40 is directly formed on the thin film encapsulation layer 30 through the first deposition process without being bonded by an optical adhesive.

The polarizer layer 40 includes a TAC layer and a PVA layer, and the TAC layer and the PVA layer may also be collectively referred to as the linear polarizer layer 401.

The TAC layer of the polarizer layer is mainly configured to support and protect the underneath PVA layer, and the TAC layer has a thickness of 40 um-60 um.

The PVA layer is a core part of the polarizer layer 40 and is mainly configured to absorb a polarization state of light in natural light, and to form polarized light over another polarization state of light. The linear polarizer layer 401 generally includes two layers of the TAC layer, and the PVA layer is disposed between the two TAC layers to better protect the PVA layer.

In one embodiment, the polarizer layer 40 may be prepared by coating a liquid crystal material. The polarizer layer 40 formed so generally has a thickness less than 2 um.

The polarizer layer 40 further includes the phase retardation layer 402 disposed between the thin film encapsulation layer 30 and the linear polarizer layer 401. The phase retardation layer 402 is configured to compensate a phase difference between a first polarizer layer (i.e., the polarizer layer 40 in FIG. 1) and a second polarizer layer (not shown) on both sides of the display module. The first polarizer layer is located adjacent to the cover layer 50, and the second polarizer layer is located far away from the cover layer 50.

In one embodiment, the linear polarizer layer 401 can also be formed by coating on the phase retardation layer 402 through an anti-solvent method, or by other methods such as transferring.

S40: forming a cover layer on the polarizer layer through a second deposition process; in this step, the cover layer 50 is directly formed on the polarizer layer 40 through the second deposition process, and no optical adhesive is needed to bond the cover layer 50 and the polarizer layer 40.

The cover layer 50 further includes a hardened layer 501 and a flexible layer 502, and the hardened layer 501 is disposed on the flexible layer 502. In one embodiment, the flexible layer 502 can be formed by coating or transferring.

The flexible layer 502 is prepared prior to forming the hardened layer 501. In one embodiment, the flexible layer 502 may be exemplified as a polyimide film.

To enhance adhesion between film layers, a layer of optical adhesive can be coated prior to forming the flexible layer 502. The cover layer 50 and adjacent layers are adhered by adhesion of an optical adhesive, thereby to reinforce bonding between the cover layer 50 of the display module and other film layers.

In one embodiment, the deposition of the hardened layer 501 is performed directly without performing a formation process of the flexibly layer 502.

In one embodiment, prior to forming the polarizer layer 40 on the thin film encapsulation layer 30, there are further steps included as follows: depositing a touch layer on the thin film encapsulation layer;
  depositing a black light shielding layer on the touch layer, and patterning the black light shielding layer to form a black matrix layer; and
  forming a color film layer by depositing the color filter layer on the black matrix layer.

In one embodiment, referring to FIG. 4, prior to forming the polarizer layer 40 on the thin film encapsulation layer 30, there are further steps included as follows:
  depositing the black light shielding layer on the thin film encapsulation layer 30, and patterning the black light shielding layer to form the black matrix layer;
  forming the color film layer 70 by depositing the color filter layer on the black matrix layer; and
  depositing the touch layer 60 on the color film layer.

In one embodiment, after forming the polarizer layer on the thin film encapsulation layer, there are further steps included as follows:
  depositing the black light shielding layer on the polarizer layer, and patterning the black light shielding layer to form a black matrix layer;
  forming the color film layer by depositing the color filter layer on the black matrix layer; and
  depositing the touch layer on the color film layer.

In one embodiment, referring to FIG. 5, after forming the polarizer layer 40 on the thin film encapsulation layer 30, there are further steps included as follows:
  depositing the touch layer 60 on the polarizer layer;
  depositing the black light shielding layer on the touch layer, and patterning the black light shielding layer to form the black matrix layer;
  depositing the color filter layer on the black matrix layer to form the color film layer.

In one embodiment, the color film layer 70 is prepared by a dyeing method, a printing method, an electroforming method, an inkjet printing method, or the like. The touch layer 60 is formed by PVD or CVD or the like.

Please refer to FIG. 6. The touch layer 60 may also be located at the thin film encapsulation layer 30 in view of the first embodiment to the third embodiment as mentioned above. That is, the touch layer 60 is directly formed in the thin film encapsulation layer 30 by a metal mesh, thereby to reduce thickness of film layer structure.

Please refer to FIG. 7. In one embodiment, an area of the polarizer layer 40 is greater than an area of a display area 80 of the display module. An orthographic projection of the polarizer layer 40 on the array substrate 10 covers an orthographic projection of the display area 80 of the display module.

In one embodiment, an area of the color film layer 70 is the same as an area of the display area 80 of the display module. An orthographic projection of the color film layer 70 on the array substrate 10 covers the orthographic projection of the display area 80 of the display module.

The present application further provides an electronic device. The electronic device includes the above-mentioned display module. The electronic device includes, but is not limited to, a mobile phone, a tablet, a computer display, a game console, a television, a display screen, a wearable device, and other living appliances or household appliances having a display function.

The present application further provides a display module and manufacturing method thereof, and an electronic device. The display module includes an array substrate, a light-emitting device layer, a thin film encapsulation layer, a touch layer, a polarizer layer, and a cover layer. The polarizer layer and the cover layer are formed on the light-emitting device layer through a deposition process. The present application improves light extraction efficiency of the light-emitting device layer by forming the polarizer layer and the cover layer on the thin film encapsulation layer through the deposition process without the use of an optical adhesive. As a further result, thickness of the entire display module is reduced, thereby improving bending resistance of the entire display module, and simplifying a bonding process of film layers at the same time.

Accordingly, although the present invention has been disclosed as a preferred embodiment, it is not intended to limit the present invention. Those skilled in the art without departing from the spirit and scope of the present invention may make various changes or modifications, and thus the scope of the present invention should be after the appended claims and their equivalents.

What is claimed is:

1. A display module, comprising:
    an array substrate;
    a light-emitting device layer disposed on the array substrate;
    a thin film encapsulation layer disposed on the light-emitting device layer;
    a polarizer layer disposed on the thin film encapsulation layer;
    a cover layer disposed on the polarizer layer; and
    a touch layer and a color film layer both disposed between the polarizer layer and the thin film encapsulation layer, wherein the color film layer is located on the touch layer.

2. The display module of claim 1, wherein the cover layer comprises a flexible layer and a hardened layer, and the hardened layer is disposed on the flexible layer, and wherein the flexible layer and the hardened layer are formed by a deposition process.

3. A method of manufacturing a display module, comprising:
    providing an array substrate;
    forming a light-emitting device layer and a thin film encapsulation layer in sequence on the array substrate;
    forming a polarizer layer on the thin film encapsulation layer through a first deposition process; and
    forming a cover layer on the polarizer layer through a second deposition process;
    wherein the cover layer comprises a flexible layer and a hardened layer, and the hardened layer is disposed on the flexible layer, wherein the flexible layer and the hardened layer are formed by the second deposition process.

4. The manufacturing method of claim 3, wherein prior to forming the polarizer layer on the thin film encapsulation layer, the manufacturing method further comprises:
    depositing a touch layer on the thin film encapsulation layer;
    depositing a black light shielding layer on the touch layer, and patterning the black light shielding layer to form a black matrix layer; and
    forming a color film layer by depositing a color filter layer on the black matrix layer.

5. The manufacturing method of claim 3, wherein prior to forming the polarizer layer on the thin film encapsulation layer, the manufacturing method further comprises:
    depositing a black light shielding layer on the thin film encapsulation layer, and patterning the black light shielding layer to form a black matrix layer;
    forming a color film layer by depositing a color filter layer on the black matrix layer; and
    depositing a touch layer on the color film layer.

6. The manufacturing method of claim 3, wherein after forming the polarizer layer on the thin film encapsulation layer, the manufacturing method further comprises:
    depositing a black light shielding layer on the polarizer layer, and patterning the black light shielding layer to form a black matrix layer;
    depositing a color filter layer on the black matrix layer to form a color film layer; and
    depositing a touch layer on the color film layer.

7. The manufacturing method of claim 3, wherein after forming the polarizer layer on the thin film encapsulation layer, the manufacturing method further comprises:
    depositing a touch layer on the polarizer layer;
    depositing a black light shielding layer on the touch layer, and patterning the black light shielding layer to form a black matrix layer;
    depositing a color filter layer on the black matrix layer to form a color film layer.

8. The manufacturing method of claim 7, wherein an area of the color film layer is the same as an area of a display area of the display module.

9. The manufacturing method of claim 7, wherein an area of the polarizer layer is greater than an area of a display area of the display module.

10. An electronic device, comprising a display module, the display module comprising:
    an array substrate;
    a light-emitting device layer disposed on the array substrate;
    a thin film encapsulation layer disposed on the light-emitting device layer;
    a polarizer layer disposed on the thin film encapsulation layer;
    a cover layer disposed on the polarizer layer; and
    a touch layer and a color film layer disposed on the touch layer, wherein the touch layer and the color film layer are disposed between the polarizer layer and the thin film encapsulation layer, or the touch layer and the color film layer are disposed between the polarizer layer and the cover layer.

11. The electronic device of claim 10, wherein the cover layer comprises a flexible layer and a hardened layer, and the hardened layer is disposed on the flexible layer, and wherein the flexible layer and the hardened layer are formed by the deposition process.

\* \* \* \* \*